(12) United States Patent
Carlsen et al.

(10) Patent No.: US 7,533,357 B2
(45) Date of Patent: May 12, 2009

(54) METHOD AND APPARATUS TO TARGET PRE-DETERMINED SPATIALLY VARYING VOLTAGE VARIATION ACROSS THE AREA OF THE VLSI POWER DISTRIBUTION SYSTEM USING FREQUENCY DOMAIN ANALYSIS

(75) Inventors: Kurt A. Carlsen, Burlington, VT (US); Amol A. Joshi, Essex Junction, VT (US); Faraydon Pakbaz, Milton, VT (US); Sanjay Upreti, Lexington, KY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 11/421,863

(22) Filed: Jun. 2, 2006

(65) Prior Publication Data

US 2007/0283299 A1 Dec. 6, 2007

(51) Int. Cl.
G06F 17/50 (2006.01)
(52) U.S. Cl. .................................. 716/4; 716/5; 716/8
(58) Field of Classification Search ................. 716/4–5, 716/8–10
See application file for complete search history.

(56) References Cited

U.S. PATENT DOCUMENTS

| | | | |
|---|---|---|---|
| 6,477,694 B1 * | 11/2002 | Irino et al. ..................... 716/15 |
| 6,550,037 B2 * | 4/2003 | Ando et al. ..................... 716/1 |
| 6,782,347 B2 * | 8/2004 | Hirano et al. ............... 702/183 |
| 6,807,656 B1 * | 10/2004 | Cao et al. ....................... 716/4 |
| 6,842,727 B1 * | 1/2005 | Hayashi ....................... 703/18 |
| 7,120,885 B2 * | 10/2006 | Nakayama et al. ............. 716/9 |
| 7,120,893 B2 * | 10/2006 | Sasaki et al. ................. 716/15 |
| 2006/0123366 A1 * | 6/2006 | Ogawa .......................... 716/5 |

* cited by examiner

*Primary Examiner*—Paul Dinh
*Assistant Examiner*—Nha T Nguyen
(74) *Attorney, Agent, or Firm*—Gibb I.P. Law Firm, LLC; Riyon Harding, Esq.

(57) ABSTRACT

A method of estimating decaps required for an IC during an initial floorplanning design phase begins by obtaining voltage variation waveforms for a plurality of nodes in a power distribution network of the IC. Next, the method computes a minimum value for each of the voltage variation waveforms and selects voltage variation waveforms below a minimum threshold value. Following this, an FDA is performed on the voltage variation waveforms below the minimum threshold value to create a set of frequency values. This involves performing an FFT on each of the voltage variation waveforms to obtain frequency domain data, wherein frequencies that cause a drop in voltage in the plurality of nodes are filtered. The method then sorts the frequency domain data, wherein the frequency domain data is arranged in order based on amplitude value, total power, frequency components, and/or amplitude of imaginary components.

16 Claims, 8 Drawing Sheets

METHOD AND APPARATUS TO TARGET PRE-DETERMINED SPATIALLY VARYING VOLTAGE VARIATION ACROSS THE AREA OF THE VLSI POWER DISTRIBUTION SYSTEM USING FREQUENCY DOMAIN ANALYSIS

BACKGROUND

1. Field of the Invention

The embodiments of the invention provide a method and apparatus to target pre-determined spatially varying voltage variation across the area of the VLSI power distribution system using frequency domain analysis.

2. Description of the Related Art

Power supply variations in application specific integrated circuits (ASICs) can cause significant issues if not addressed properly. As the technology is advancing, resolving these issues is not a one point process. These issues have to be addressed during the entire design cycle. At early stages of the design, there is a lot more flexibility to make changes to placement of circuit and as the placement matures, there is a need to estimate the number of decoupling capacitors (also referred to herein as "decaps") needed. As placement changes, the decap numbers can also change. Hence these have to be estimated hand-in-hand ahead of time.

Placement of circuits in ASICs can be an iterative process; and, estimating decaps can further add to these iterations. Historically, estimation of decaps has been a lengthy iterative process with no scientific and engineering approach of calculating the right numbers. Currently, estimation of decaps uses guidelines or impedance matching techniques. Using guidelines involves no knowledge of a floorplan. This provides a switching activity that is based on stand alone calculations. Impedance matching techniques are iterative processes that need matured floorplan and timing data.

SUMMARY

The embodiments of the invention provide a method, service, system, computer program product, etc. to target pre-determined spatially varying voltage variation across the area of the VLSI power distribution system using frequency domain analysis. A method of estimating an amount of decoupling capacitance required for an integrated circuit during an initial floorplanning design phase begins by obtaining voltage variation waveforms for a plurality of nodes in a power distribution network of the integrated circuit. Next, the method computes a minimum value for each of the voltage variation waveforms and selects voltage variation waveforms below a minimum threshold value.

Following this, a frequency domain analysis is performed on the voltage variation waveforms below the minimum threshold value to create a set of frequency values. This involves performing a fast fourier transform on each of the voltage variation waveforms to obtain frequency domain data, wherein frequencies that cause a drop in voltage in the plurality of nodes are filtered. The method then sorts the frequency domain data, wherein the frequency domain data is arranged in order based on amplitude value, total power, frequency components, and/or amplitude of imaginary components.

Next, the method performs a peak imaginary analysis and/or a weighted frequency analysis on the frequency values and calculates the amount of decoupling capacitance required based on results of the peak imaginary analysis and/or the weighted frequency analysis. More specifically, the peak imaginary analysis obtains a set of peak imaginary values, which are used to calculate the amount of decoupling capacitance required. The set of peak imaginary values include a frequency at which magnitude is maximum, a value of an imaginary component at the frequency at which magnitude is maximum, a frequency at which the imaginary component is maximum, and a peak value of the imaginary component.

The performing of the weighted frequency analysis is performed when a power drop is caused by multiple frequencies. Specifically, the weighted frequency analysis obtains dominant frequencies below a frequency at which a magnitude is maximum and imaginary values of the dominant frequencies. Subsequently, weighted dominant frequencies and weighted imaginary values are calculated based on the dominant frequencies and the imaginary values. The calculating of the amount of decoupling capacitance required is based on the weighted dominant frequencies and the weighted imaginary values.

The embodiments herein further provide a system for estimating an amount of decoupling capacitance required for an integrated circuit during an initial floorplanning design phase. The system includes a voltage detector to obtain voltage variation waveforms for a plurality of nodes in a power distribution network of the integrated circuit. Moreover, a processor is provided to compute a minimum value for each of the voltage variation waveforms and select voltage variation waveforms below a minimum threshold value.

The system also includes a first model to perform a frequency domain analysis on the voltage variation waveforms below the minimum threshold value to create a set of frequency values. When the first model performs the frequency domain analysis, the first model performs a fast fourier transform on each of the voltage variation waveforms to obtain frequency domain data, wherein frequencies that cause a drop in voltage in the plurality of nodes are filtered.

The system further comprises a second model and a calculator, wherein the second model performs a peak imaginary analysis and/or a weighted frequency analysis on the frequency values. The calculator calculates the amount of decoupling capacitance required based on results of the peak imaginary analysis and/or the weighted frequency analysis.

More specifically, when the second model performs the peak imaginary analysis, the second model obtains a set of peak imaginary values, which are used by the calculator when calculating the amount of decoupling capacitance required. The set of peak imaginary values include a frequency at which magnitude is maximum, a value of an imaginary component at the frequency at which magnitude is maximum, a frequency at which the imaginary component is maximum, and a peak value of the imaginary component.

The second model can perform the weighted frequency analysis when a power drop is caused by multiple frequencies. Specifically, when the second model performs the weighted frequency analysis, the second model obtains dominant frequencies below a frequency at which a magnitude is maximum and imaginary values of the dominant frequencies. The second model further calculates weighted dominant frequencies and weighted imaginary values based on the dominant frequencies and the imaginary values. Moreover, the calculator calculates the amount of decoupling capacitance required based on the weighted dominant frequencies and the weighted imaginary values.

Thus, embodiments herein provide numerous advantages, including a one pass method to estimate decaps and the ability to address spatially varying criteria for stable power supply (peak to peak, compression, etc.). Further, multiple floorplan versus decap requirement scenarios can be performed with a fast turn around time (TAT). Additionally, embodiments herein facilitate first order board/package/chip co-analysis jitter estimations with fast turn around and the definition of optimal die size and saving of silicon real estate whenever possible. The above advantages facilitate virtual prototyping to make decisions for die size, jitter budget and power variation criteria.

Accordingly, the embodiments of the invention estimate decaps in one iteration by considering a typical worse case switching activity. The methods estimate the decap needs in one iteration using frequency domain analysis (also referred to herein as "FDA"). Embodiments herein estimate the number of decoupling capacitors needed using FDA of voltage variations obtained as a result of full power grid analysis. The high amplitude frequencies are filtered by defining the cutoff frequency and the equating the imaginary component the voltage variation waveform to the reactance corresponding to the needed capacitance.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
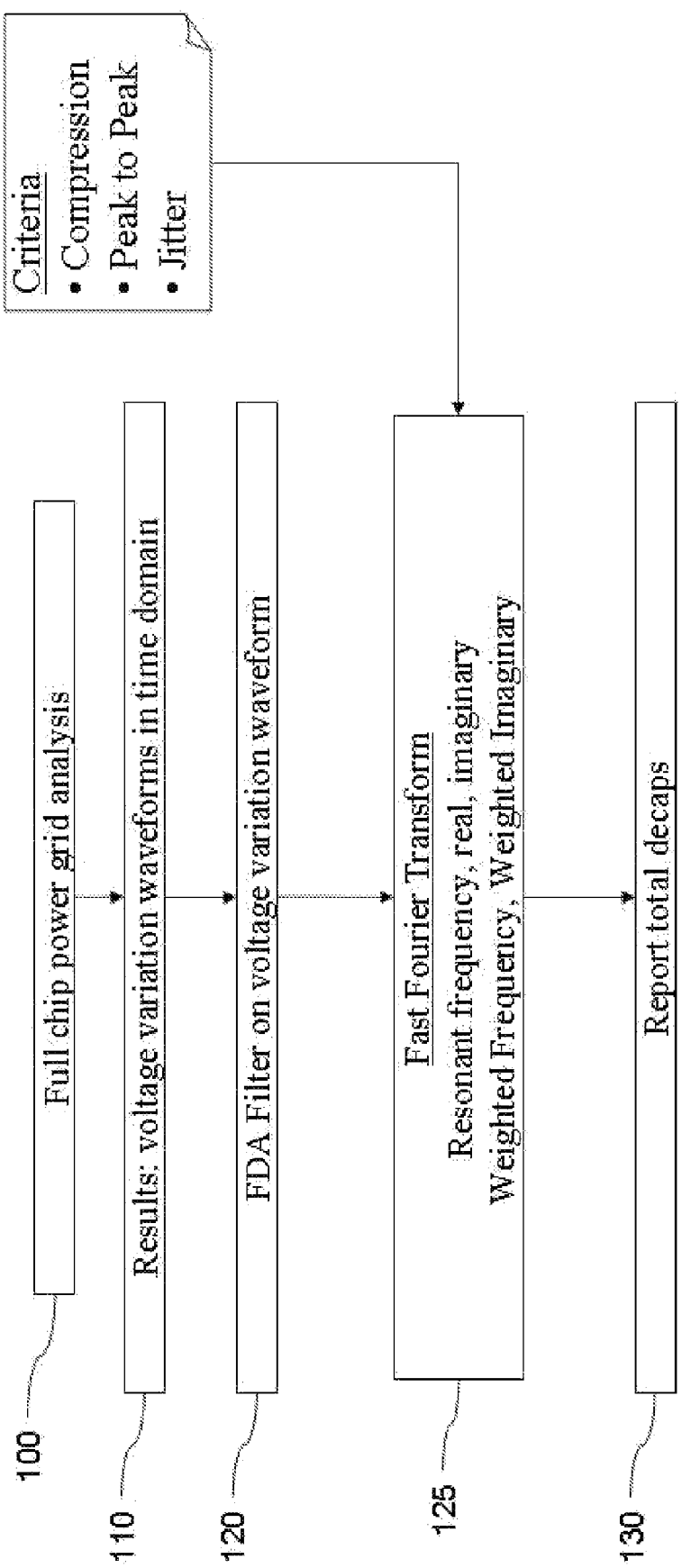
FIG. 1 is a flow diagram illustrating a method to target pre-determined spatially varying voltage variation across the area of the VLSI power distribution system.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention estimate decaps in one iteration by considering a typical worse case switching activity. The methods estimate the decap needs in one iteration using frequency domain analysis (also referred to herein as "FDA"). Embodiments herein estimate the number of decoupling capacitors needed using FDA of voltage variations obtained as a result of full power grid analysis. The high amplitude frequencies are filtered by defining the cutoff frequency and the equating the imaginary component the voltage variation waveform to the reactance corresponding to the needed capacitance.

Methods for estimation of decaps start with a power grid analysis. Depending on the stage of the design process, there can be the following scenarios for placement of circuits. The methods expect that the designer has identified all of the circuits that can cause big power drops. Typically, these are inputs/outputs (IOs), memory arrays, and clock buffers. Such circuits are referred to as objects of interest (also referred to herein as "OOI"). The minimum requirement to start the process is as follows.

Referring to FIG. 1, the initial setup comprises instantiation and placement of all OOIs. This involves a menu image from the design library and customization to the menu image if it can be a very short time (typically few hours). Depending on the flexibility and in the interest of time, a designer can spend anywhere between a few hours to a couple of days to get an initial placement that represents the best placement to their requirements. No power routing or wiring is required in the initial setup if an IBM ChipBench TREND power grid analysis tool is used (available from International Business machines, Armonk, N.Y., USA). After a full chip power grid analysis 100 is performed, results 110 are typically obtained in the form of a voltage variation waveform (voltage supply (VDD) minus ground (GND)) at each node of the power grid.

Following this, the compression is computed at each waveform. Next, the waveforms that do not meet the compression limit criteria are selected. These criteria can be compression limit of peak to peak variation. An FDA is subsequently performed on these waveforms that do not meet the specifications.

Figure 2:
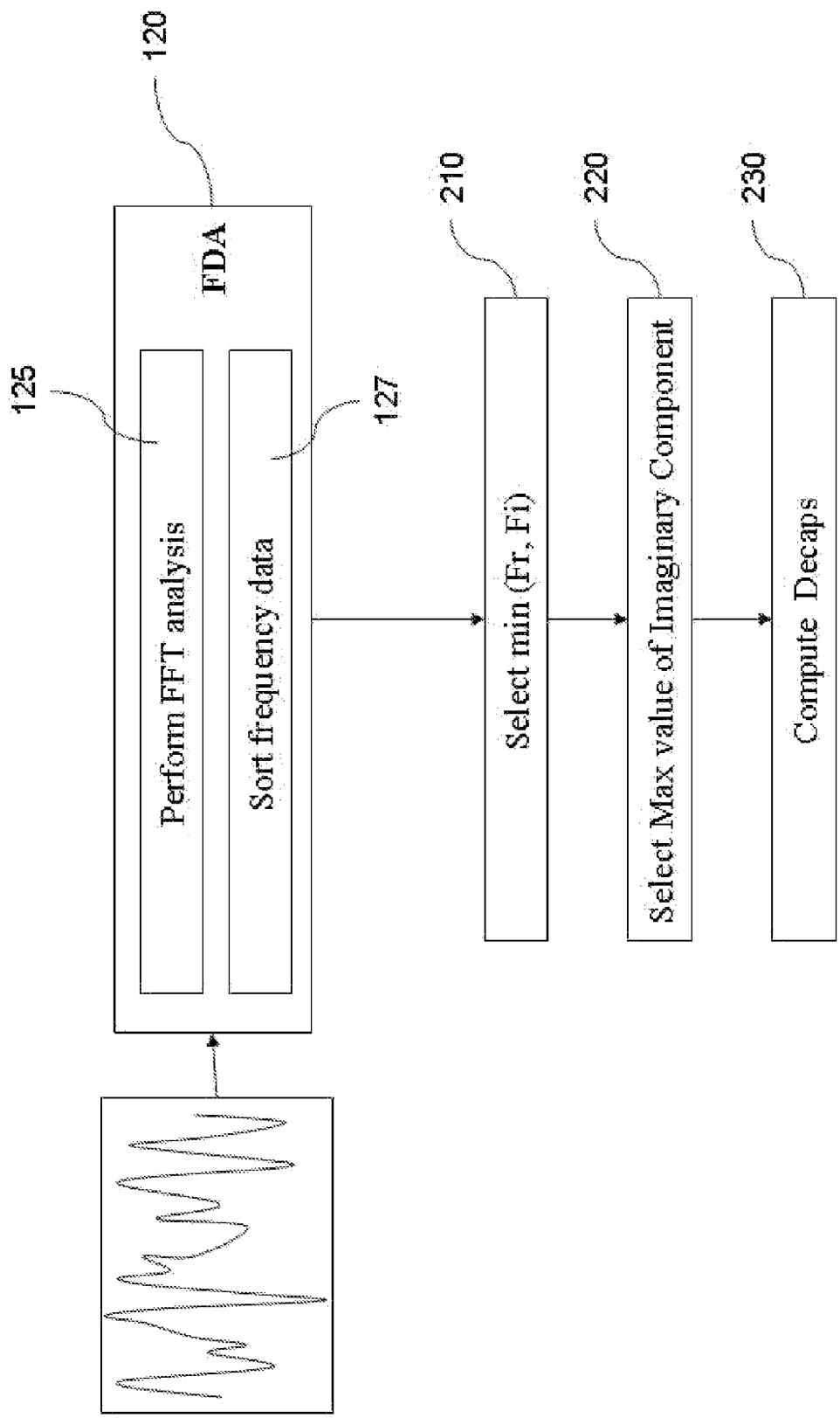
FIG. 2 is a flow diagram illustrating a peak imaginary analysis.
Figure 3:
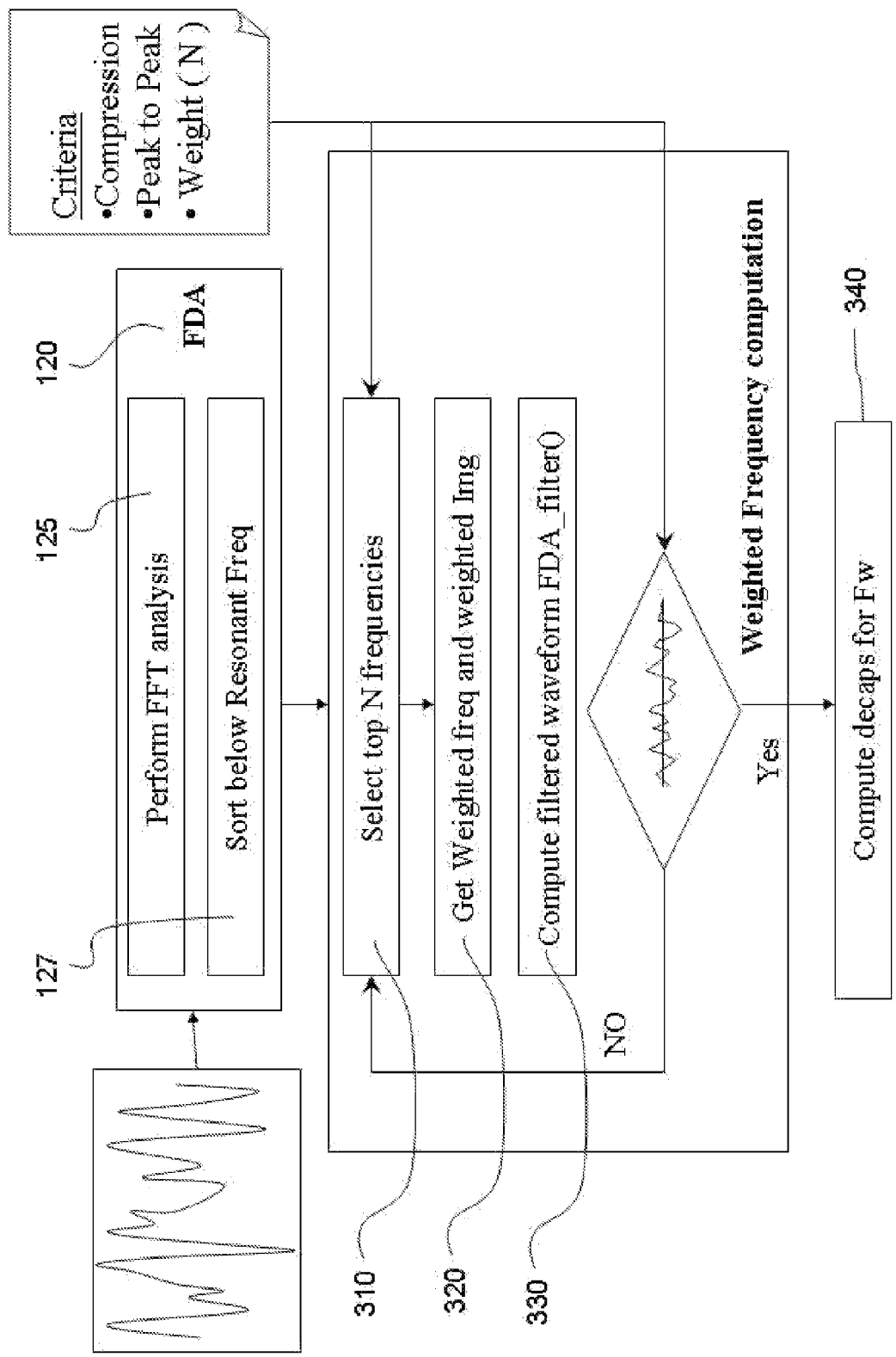
FIG. 3 is a flow diagram illustrating a weighted frequency analysis.

The FDA 120 is performed, wherein the goal is to filter the frequencies that cause the drop in the power grid nodes. More specifically, as illustrated in FIGS. 1-2, a fast fourier transform 125 (also referred to herein as "FFT") is performed on each waveform. This includes obtaining frequency components, real, and imaginary values (or the impedance profile) at each frequency. The FFT 125 is a standard mathematical technique that performs discrete fourier transform based on a binary decomposition algorithm. It takes in an analog signal and samples it at user-specified time-stamps in such a way that the total number of points is such that it has only one bit on and the rest of the bits off (basically an exponent of 2, such as 2, 4, 8, 16, 32, 64, 128, 256, 512, 1024, 2048, 4096, etc.). The more number of points, the finer the analog signal can be sampled and the better it can be represented. Once such sampling is done, the data is binary-sorted in item 127 (as illustrated in FIGS. 2-3), wherein the data samples with exactly 180 degrees out of phase are grouped together (using sine and cosine trigonometric functions). They are then combined in phase and a resultant frequency domain spectrum is achieved. Since the algorithm uses a kind of binary search, it is NlogN compute intensive as against the "ordinary fourier transform", which is N*N compute intensive. Thus, there is typically a gain of N/Log2N speed, hence it is called a fast fourier transform. There are various other ways to perform a fast fourier transform as well. After the FFT 125, the estimation of decaps 130 can be done using a peak imaginary method 200 and/or a weighted frequency method 300.

Referring to FIG. 2, the peak imaginary method 200 concentrates on removing the dominant frequency and gives an effective solution for one or two dominant frequencies. More specifically, the peak imaginary method obtains the following values in items 210 and 220: Fr, Ifr, Fi, and Ip. The frequency at which the magnitude [Sqrt (real*real+Imaginary*Imaginary)] is maximum is called the resonant frequency (Fr). Moreover, the Ifr value is the value of the imaginary component at Fr. Further, the Fi value is the frequency at which the imaginary component is maximum; and, the Ip value is the value of the imaginary component where it peaks. Thus, the decoupling capacitor is calculated in item 230 using the following formula: C=1/(2*PI*min(Fr, Fi)*max(Ifr, Ip)).

Referring to FIG. 3, the weighted frequency method 300 is effective when there are multiple frequencies with high magnitude causing the power drop. Here dominant frequencies below Fr are selected and their imaginary values are selected and weighted. Weight has a default value of two and it is user defined criteria. The weighted frequency method is advantageous because, in cases where the imaginary component is too weak at the resonant frequency, it will still produce a reasonable value of decoupling capacitance instead of an unrealistically large value (decap is inversely proportional to the imaginary component value). The following is considering the weight of 3, wherein Fr, Fr-1, Fr-2 (dominant frequency below Fr) and Ir, Ir-1 Ir-2 (imaginary values corresponding to Fr, Fr-1, Fr-2) are obtained in item 310. Next, Fw and Iw are obtained (weighted frequency and imaginary) in item 320. Specifically, Fw=Σ(Fr-n*Ir-n)÷ΣIr-n; and Iw=Σ(Fr-n*Ir-n)÷ΣFr-n.

One of the advantages of this method is performing the upfront filtering of the culprit frequencies and comparing them with the original waveform. This helps to eliminate the fuller chip simulations. As stated earlier, depending on the weight, the resonant frequency and the frequencies below it are selected. If the weight is 3 then Fr Fr-1 and Fr-2 are selected.

In item 330, FDA_Filter( ) is a software function that filters out one or more frequencies and reconstructs a waveform with the remaining frequencies. In this example, it will filter Fr, Fr-1 and Fr-2 to produce a new waveform excluding them. The minimum value of this voltage variation waveform is then compared with the target limit. If it satisfies the criteria, the algorithm moves to next step else the weight is incremented and the loop is executed once again. This helps to come with an exact weight in an automatic fashion, thereby avoiding the number of spice simulations. Avoiding or reducing simulation is preferable at the floorplanning stage. This algorithm provides a mechanism to execute this method. The decoupling capacitor is subsequently calculated in item 340 using the following formula: C=1/(2*PI*Fw*Iw).

The method computes the decaps by the peak imaginary method 200 and the weighted frequency method 300. There can be cases where either method may be useful or the combination of both may need to be done. The method can place the decaps at the exact location based on the amount of silicon space available (by quering the floorplan). This can give a much optimal solution. The method further gives the actual capacitance needed and this can be converted into the number of decap circuits actually available in the library. This gives more flexibility to the users to choose the decaps based on their size to fit in the exact amount by choosing the combination of different sizes of decaps circuits. While combining the results from both the methods, the user can make a choice depending on available white space, amount of computed decaps by each method, and the choice of physical cell that can serve the physical and electrical requirements. Physical requirements ensures that the equivalent number of decap cell can be placed; and, electrical requirements ensure that the library has the decap cells that can produce the required number of capacitance.

The following provides an application example. Since the magnitude of the largest frequency at each node or tile (local resonant frequency) is targeted for calculating capacitance, it can be used to do the following based on the fact that "voltage compression" greatly impacts the effectiveness of amount of decaps added. The following formula is used: Delta_T=(C)×(Percent_compression)×((V^2)/P), wherein "Delta_T" is the time in seconds before compression exceeds targeted percentage (i.e., 5% or 10%, etc). Moreover, "C" is the decoupling capacitance in Farads (this is calculated from the FDA 120). Further, "P" is the average power dissipation of chip, in watts (this can be calculated from power spread sheet); and, "V" is the supply voltage in volts.

Figure 4:
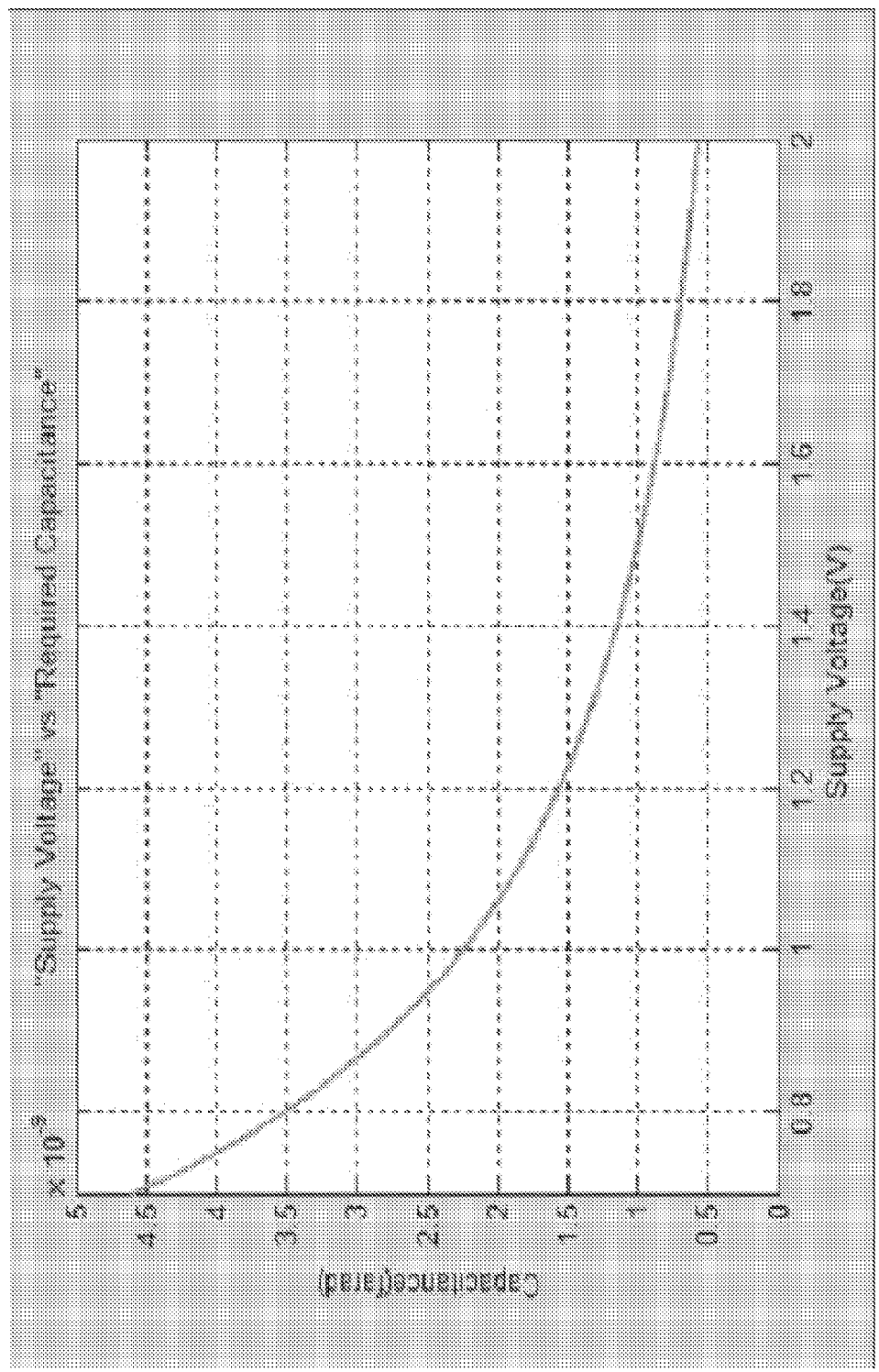
FIG. 4 is a chart illustrating supply voltage versus required capacitance.

For example, if chip power is 1 watt, the available decoupling capacitance is 1 nf with supply of 1.5 V, and there is a target "compression" of 5%, the time that capacitance will provide charge to support this compression is: Delta_T=(1 nf )×(0.05)×(1.5^2/1)=112.5 ps. The assumption is that after 112.5 ps, the power supply regulator can provide the adequate current. FIG. 4 illustrates a simulation of the above formula. Keeping "Delta_T=112.5 ps", "Power=1 W", and "compression=5%", the change in voltage versus capacitance needed is shown.

Accordingly, the embodiments of the invention provide a method, service, system, computer program product, etc. to target predetermined spatially varying voltage variation across the area of the VLSI power distribution system using frequency domain analysis. A method of estimating an amount of decoupling capacitance required for an integrated circuit during an initial floorplanning design phase begins by obtaining voltage variation waveforms for a plurality of nodes in a power distribution network of the integrated circuit. As described above, after the full chip power grid analysis 100 is performed, the results 110 are typically obtained in the form of a voltage variation waveform (VDD minus GND) at each node of the power grid. Next, the method computes a minimum value for each of the voltage variation waveforms and selects voltage variation waveforms below a minimum threshold value. As described above, the minimum criteria can be compression limit of peak to peak variation.

Following this, a frequency domain analysis (i.e., the FDA 120) is performed on the voltage variation waveforms below the minimum threshold value to create a set of frequency values. As described above, the goal is to filter the frequencies that cause the drop in the power grid nodes. This involves performing a fast fourier transform (i.e., the FFT 125) on each of the voltage variation waveforms to obtain frequency domain data, wherein frequencies that cause a drop in voltage in the plurality of nodes are filtered. As described above, the FFT 125 obtains frequency components, real, and imaginary values (or the impedance profile) at each frequency. The method then sorts the frequency domain data, wherein the frequency domain data is arranged in order based on amplitude value, total power, frequency components, and/or amplitude of imaginary components. As described above, the data samples with exactly 180 degrees out of phase are grouped together (using sine and cosine trigonometric functions) and combined in phase, wherein a resultant frequency domain spectrum is achieved.

Next, the method performs a peak imaginary analysis 200 and/or a weighted frequency analysis 300 on the frequency values and calculates the amount of decoupling capacitance required based on results of the peak imaginary analysis 200 and/or the weighted frequency analysis 300. More specifically, the peak imaginary analysis 200 obtains a set of peak imaginary values, which are used to calculate the amount of decoupling capacitance required. As described above, the peak imaginary analysis 200 concentrates on removing the dominant frequency and gives an effective solution for one or two dominant frequencies. The set of peak imaginary values include a frequency at which magnitude is maximum, a value of an imaginary component at the frequency at which magnitude is maximum, a frequency at which the imaginary component is maximum, and a peak value of the imaginary component. As also described above, the decoupling capacitor is calculated using the following formula: C=1/(2*PI*min(Fr, Fi)*max(Ifr, Ip)).

The performing of the weighted frequency analysis 300 is performed when a power drop is caused by multiple frequencies. As described above, dominant frequencies below Fr are selected and their imaginary values are selected and weighted. Weight has a default value of two and it is user defined criteria. Specifically, the weighted frequency analysis 300 obtains dominant frequencies below a frequency at which a magnitude is maximum and imaginary values of the dominant frequencies. Subsequently, weighted dominant frequencies and weighted imaginary values are calculated based on the dominant frequencies and the imaginary values. The calculating of the amount of decoupling capacitance required is based on the weighted dominant frequencies and the weighted imaginary values. As also described above, the decoupling capacitor is calculated using the following formula: C=1/(2*PI*Fw*Iw).

Figure 5:
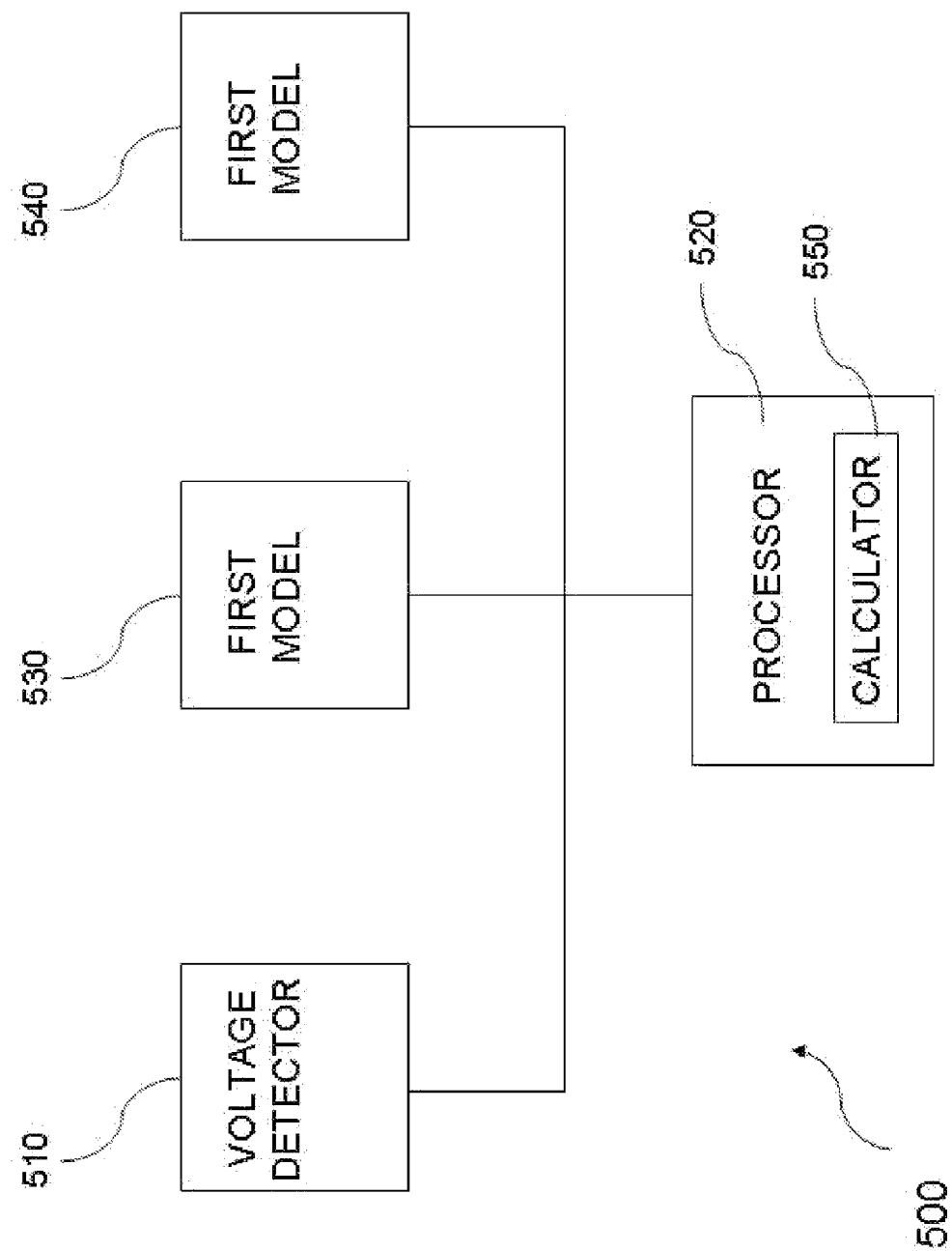
FIG. 5 is a diagram illustrating a system to target pre-determined spatially varying voltage variation across the area of the VLSI power distribution system.

As illustrated in FIG. 5, the embodiments herein further provide a system 500 for estimating an amount of decoupling capacitance required for an integrated circuit during an initial floorplanning design phase. The system includes a voltage detector 510 adapted to obtain voltage variation waveforms for a plurality of nodes in a power distribution network of the integrated circuit. As described above, after the full chip power grid analysis 100 is performed, the results 110 are typically obtained in the form of a voltage variation waveform (VDD minus GND) at each node of the power grid. Moreover, a processor 520 is provided that is adapted to compute a minimum value for each of the voltage variation waveforms and select voltage variation waveforms below a minimum threshold value. As described above, the minimum criteria can be compression limit of peak to peak variation.

The system also includes a first model 530 adapted to perform a frequency domain analysis (i.e., the FDA 120) on the voltage variation waveforms below the minimum threshold value to create a set of frequency values. As described above, the goal is to filter the frequencies that cause the drop in the power grid nodes. When the first model 530 performs the frequency domain analysis, the first model 530 is further adapted to perform a fast fourier transform (i.e., the FFT 125) on each of the voltage variation waveforms to obtain frequency domain data, wherein frequencies that cause a drop in voltage in the plurality of nodes are filtered. As also described above, the FFT 125 is a standard mathematical technique that performs discrete fourier transform based on a binary decomposition algorithm. It takes in an analog signal and samples it at user-specified time-stamps in such a way that the total number of points is such that it has only one bit on and the rest of the bits off.

The system further comprises a second model 540 and a calculator 550, wherein the second model 540 is adapted to perform a peak imaginary analysis 200 and/or a weighted frequency analysis 300 on the frequency values. The calculator 550 may be in the processor 520 and is adapted to calculate the amount of decoupling capacitance required based on results of the peak imaginary analysis 200 and/or the weighted frequency analysis 300.

More specifically, when the second model 540 performs the peak imaginary analysis 200, the second model 540 is further adapted to obtain a set of peak imaginary values, which are used by the calculator 550 when calculating the amount of decoupling capacitance required. As described above, the peak imaginary analysis 200 concentrates on removing the dominant frequency and gives an effective solution for one or two dominant frequencies. The set of peak imaginary values include a frequency at which magnitude is maximum, a value of an imaginary component at the frequency at which magnitude is maximum, a frequency at which the imaginary component is maximum, and a peak value of the imaginary component. As also described above, the decoupling capacitor is calculated using the following formula: C=1/(2*PI*min(Fr, Fi)*max(Ifr, Ip)).

The second model 540 is adapted to perform the weighted frequency analysis 300 when a power drop is caused by multiple frequencies. As described above, the weighted frequency analysis 300 is advantageous because, in cases where the imaginary component is too weak at the resonant frequency, it will still produce a reasonable value of decoupling capacitance instead of an unrealistically large value (decap is inversely proportional to the imaginary component value). Specifically, when the second model 540 performs the weighted frequency analysis, the second model 540 is further adapted to obtain dominant frequencies below a frequency at which a magnitude is maximum and imaginary values of the dominant frequencies. The second model 540 is further adapted to calculate weighted dominant frequencies and weighted imaginary values based on the dominant frequencies and the imaginary values. Moreover, the calculator 550 is adapted to calculate the amount of decoupling capacitance required based on the weighted dominant frequencies and the weighted imaginary values. As also described above, the decoupling capacitor is calculated using the following formula: C=1/(2*PI*Fw*Iw).

Figure 6A:
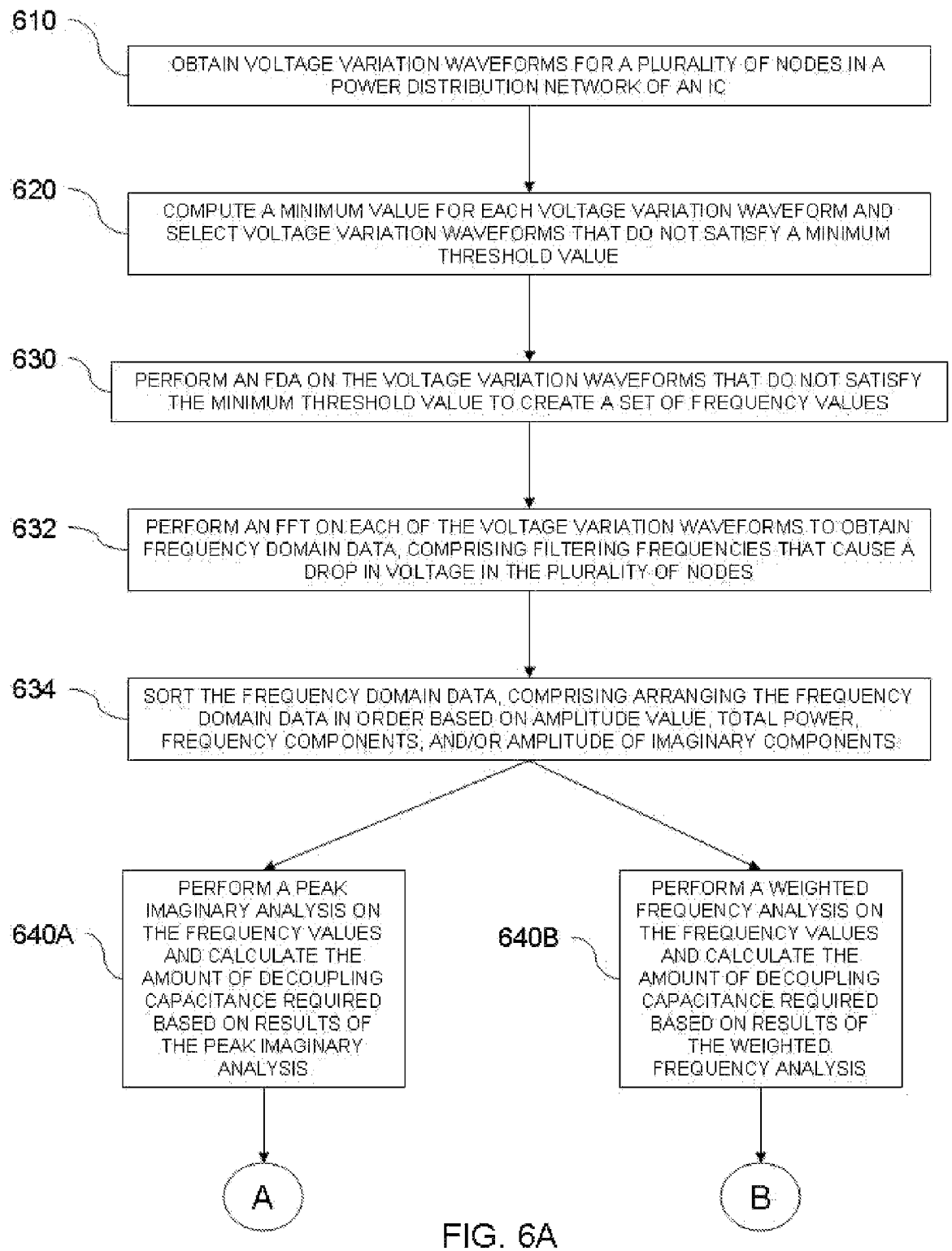
FIGS. 6A, 6B, and 6C are flow diagrams illustrating a method to target pre-determined spatially varying voltage variation across the area of the VLSI power distribution system.
Figure 6B:
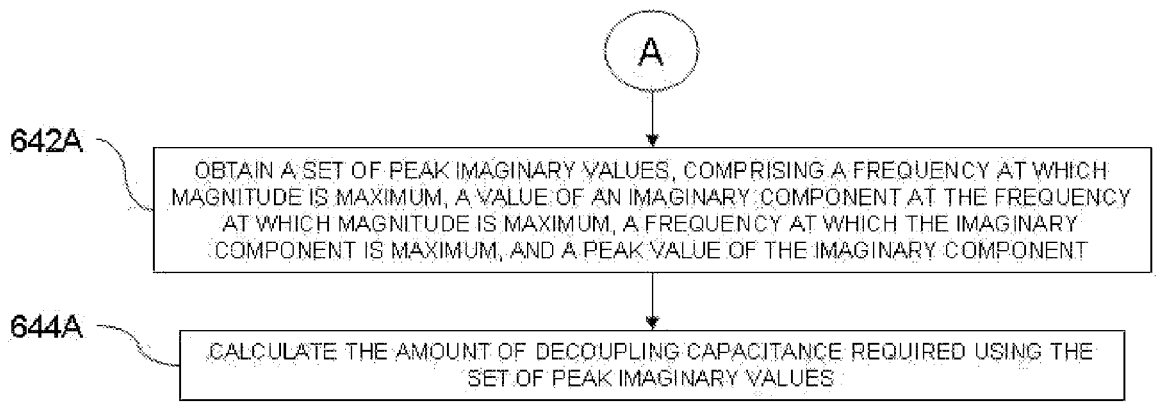
Figure 6C:
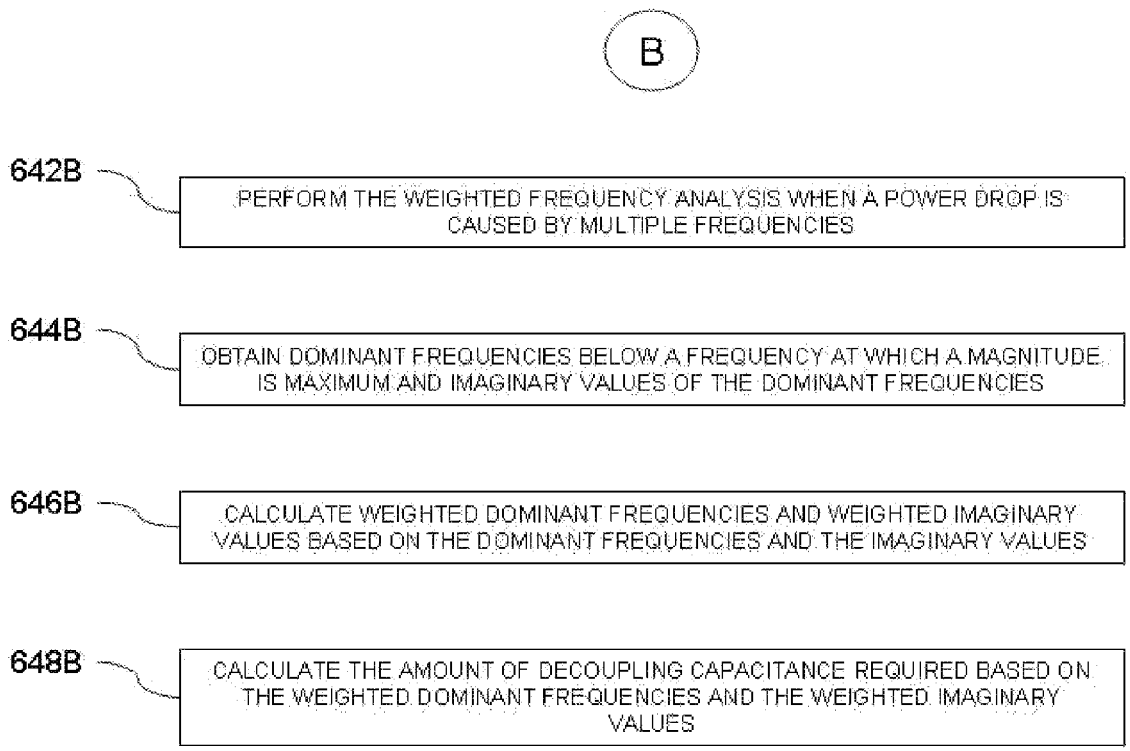

FIGS. 6A-6C illustrate flow diagrams for a method to target pre-determined spatially varying voltage variation across the area of the VLSI power distribution system using frequency domain analysis. Referring to item 610 in FIG. 6A, the method begins by obtaining voltage variation waveforms for a plurality of nodes in a power distribution network of the integrated circuit. As described above, after the full chip power grid analysis 100 is performed, the results 110 are typically obtained in the form of a voltage variation waveform (VDD minus GND) at each node of the power grid. Next, in item 620, the method computes a minimum value for each of the voltage variation waveforms and selects voltage variation waveforms below a minimum threshold value. As described above, the minimum criteria can be compression limit of peak to peak variation.

Following this, in item 630, a frequency domain analysis (i.e., the FDA 120) is performed on the voltage variation waveforms below the minimum threshold value to create a set of frequency values. As described above, the goal is to filter the frequencies that cause the drop in the power grid nodes. This involves, in item 640, performing a fast fourier transform (i.e., the FFT 125) on each of the voltage variation waveforms to obtain frequency domain data, wherein frequencies that cause a drop in voltage in the plurality of nodes are filtered. As described above, the FFT 125 obtains frequency components, real, and imaginary values (or the impedance profile) at each frequency. The method then sorts the frequency domain data in item 634, wherein the frequency domain data is arranged in order based on amplitude value, total power, frequency components, and/or amplitude of imaginary components. As described above, the data samples with exactly 180 degrees out of phase are grouped together (using sine and cosine trigonometric functions) and combined in phase, wherein a resultant frequency domain spectrum is achieved.

Next, the method performs a peak imaginary analysis 200 (in item 640A) and/or a weighted frequency analysis 300 (in item 640B) on the frequency values and calculates the amount of decoupling capacitance required based on results of the peak imaginary analysis 200 and/or the weighted frequency analysis 300. More specifically, referring to item 642A in FIG. 6B, the peak imaginary analysis 200 obtains a set of peak imaginary values, which include a frequency at which magnitude is maximum, a value of an imaginary component at the frequency at which magnitude is maximum, a frequency at which the imaginary component is maximum, and a peak value of the imaginary component. As described above, the peak imaginary analysis 200 concentrates on removing the dominant frequency and gives an effective solution for one or two dominant frequencies. Subsequently, in item 644B, the set of peak imaginary values are used to calculate the amount of decoupling capacitance required. As also described above, the decoupling capacitor is calculated using the following formula: $C=1/(2*PI*\min(Fr, Fi)*\max(Ifr, Ip))$.

Referring now to item 642B in FIG. 6C, the weighted frequency analysis 300 is performed when a power drop is caused by multiple frequencies. As described above, dominant frequencies below Fr are selected and their imaginary values are selected and weighted. Weight has a default value of two and it is user defined criteria. Specifically, in item 644B, the weighted frequency analysis 300 obtains dominant frequencies below a frequency at which a magnitude is maximum and imaginary values of the dominant frequencies. Subsequently, in item 646B, weighted dominant frequencies and weighted imaginary values are calculated based on the dominant frequencies and the imaginary values. In item 648B, the calculating of the amount of decoupling capacitance required is based on the weighted dominant frequencies and the weighted imaginary values. As also described above, the decoupling capacitor is calculated using the following formula: $C=1/(2*PI*Fw*Iw)$.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
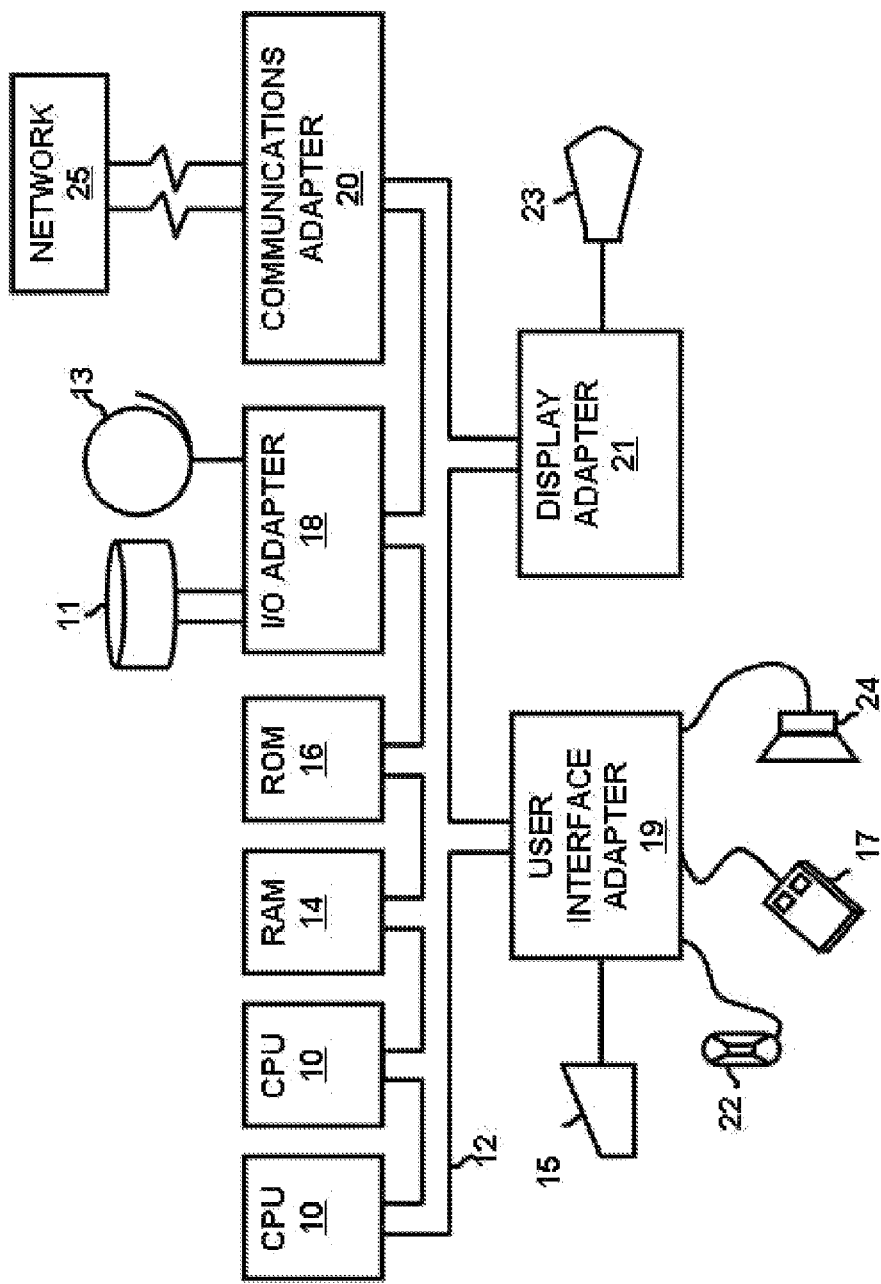
FIG. 7 is a diagram illustrating a computer program product for targeting pre-determined spatially varying voltage variation across the area of the VLSI power distribution system.

A representative hardware environment for practicing the embodiments of the invention is depicted in FIG. 7. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Accordingly, the embodiments of the invention estimate decaps in one iteration by considering a typical worse case switching activity. The methods estimate the decap needs in one iteration using frequency domain analysis (also referred to herein as "FDA"). Embodiments herein estimate the number of decoupling capacitors needed using FDA of voltage variations obtained as a result of full power grid analysis. The high amplitude frequencies are filtered by defining the cutoff frequency and the equating the imaginary component the voltage variation waveform to the reactance corresponding to the needed capacitance.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of estimating an amount of decoupling capacitance required for an integrated circuit during an initial floor-planning design phase, with instructions embodied on a computer readable storage device configured to execute on a computer, comprising:

obtaining voltage variation waveforms for a plurality of nodes in a power distribution network of said integrated circuit;

computing a minimum value for each of said voltage variation waveforms;

selecting voltage variation waveforms below a minimum threshold value;

performing a frequency domain analysis on said voltage variation waveforms below said minimum threshold value to create a set of frequency values and equating an imaginary component of said voltage variation waveforms to a reactance corresponding to a needed decoupling capacitance;

wherein said performing of said frequency domain analysis comprises performing a fast fourier transform on each of said voltage variation waveforms to obtain frequency domain data, comprising filtering frequencies that cause a drop in voltage;

performing a peak imaginary analysis on said frequency values to obtain a set of peak imaginary values;

wherein said obtaining of said set of peak imaginary values comprises obtaining a frequency at which magnitude is maximum, a value of an imaginary component at said frequency at which magnitude is maximum, a frequency at which said imaginary component is maximum, and a peak value of said imaginary component; and calculating said amount of decoupling capacitance required using said peak imaginary values.

2. The method according to claim 1, further comprising sorting said frequency domain data, comprising arranging said frequency domain data in order based on at least one of amplitude value, total power, frequency components, and amplitude of imaginary components.

3. The method according to claim 1, wherein said calculating of said amount of decoupling capacitance required comprises using said frequency at which magnitude is maximum, said value of said imaginary component at said frequency at which magnitude is maximum, said frequency at which said imaginary component is maximum, and said peak value of said imaginary component.

4. The method according to claim 1, further comprising performing a weighted frequency analysis on said frequency values, when said frequency domain analysis indicates a power drop caused by multiple frequencies.

5. The method according to claim 4, wherein said performing of said weighted frequency analysis comprises obtaining:

dominant frequencies below a frequency at which a magnitude is maximum; and imaginary values of said dominant frequencies.

6. The method according to claim 5, wherein said performing of said weighted frequency analysis further comprises calculating weighted dominant frequencies and weighted imaginary values based on said dominant frequencies and said imaginary values.

7. The method according to claim 6, further comprising calculating said amount of decoupling capacitance required based on said weighted dominant frequencies and said weighted imaginary values.

8. A method of estimating an amount of decoupling capacitance required for an integrated circuit during an initial floor-planning design phase, with instructions embodied on a computer readable storage device configured to execute on a computer, comprising:

obtaining voltage variation waveforms for a plurality of nodes in a power distribution network of said integrated circuit;

computing a minimum value for each of said voltage variation waveforms;

selecting voltage variation waveforms below a minimum threshold value;

performing a frequency domain analysis on said voltage variation waveforms below said minimum threshold value to create a set of frequency values and equating an imaginary component of said voltage variation waveforms to a reactance corresponding to a needed decoupling capacitance, wherein said performing of said frequency domain analysis comprises performing a fast fourier transform on each of said voltage variation waveforms to obtain frequency domain data, said frequency domain data comprising multiple frequencies that cause a drop in voltage;

performing a weighted frequency analysis on said frequency values;

wherein said performing of said weighted frequency analysis comprises obtaining dominant frequencies below a frequency at which a magnitude is maximum and obtaining imaginary values of said dominant frequencies;

wherein said performing of said weighted frequency analysis further comprises calculating weighted dominant frequencies and weighted imaginary values based on said dominant frequencies and said imaginary values; and calculating said amount of decoupling capacitance required based on results of said weighted frequency analysis.

9. The method according to claim 8, wherein said calculating of said amount of decoupling capacitance required is based on said weighted dominant frequencies and said weighted imaginary values.

10. A service of estimating an amount of decoupling capacitance required for an integrated circuit during an initial floorplanning design phase, with instructions embodied on a computer readable storage device configured to execute on a computer, comprising:

obtaining voltage variation waveforms for a plurality of nodes in a power distribution network of said integrated circuit;

computing a minimum value for each of said voltage variation waveforms;

selecting voltage variation waveforms below a minimum threshold value;

performing a frequency domain analysis on said voltage variation waveforms below said minimum threshold value to create a set of frequency values and equating an imaginary component of said voltage variation waveforms to a reactance corresponding to a needed decoupling capacitance, wherein said performing of said frequency domain analysis comprises performing a fast fourier transform on each of said voltage variation waveforms to obtain frequency domain data, said frequency domain data comprising multiple frequencies that cause a drop in voltage;

performing a weighted frequency analysis on said frequency values;

wherein said performing of said weighted frequency analysis comprises obtaining dominant frequencies below a frequency at which a magnitude is maximum and obtaining imaginary values of said dominant frequencies;

wherein said performing of said weighted frequency analysis further comprises calculating weighted dominant frequencies and weighted imaginary values based on said dominant frequencies and said imaginary values; and calculating said amount of decoupling capacitance required based on results of said weighted frequency analysis.

11. The service according to claim 10, wherein said calculating of said amount of decoupling capacitance required is based on said weighted dominant frequencies and said weighted imaginary values.

12. A system for estimating an amount of decoupling capacitance required for an integrated circuit during an initial floorplanning design phase, comprising:

a voltage detector adapted configured to obtain voltage variation waveforms for a plurality of nodes in a power distribution network of said integrated circuit;

a memory that stores said voltage variation waveforms;

a processor configured to:

compute a minimum value for each of said voltage variation waveforms and select voltage variation waveforms below a minimum threshold value;

perform a frequency domain analysis on said voltage variation waveforms below said minimum threshold value to create a set of frequency values and equate an imaginary component of said voltage variation waveforms to a reactance corresponding to a needed decoupling capacitance, wherein said performing of said frequency domain analysis comprises performing a fast fourier transform on each of said voltage variation waveforms to obtain frequency domain data, said frequency domain data comprising multiple frequencies that cause a drop in voltage;

perform a weighted frequency analysis on said frequency values; and wherein said processor perform said weighted frequency analysis by obtaining dominant frequencies below a frequency at which a magnitude is maximum, and obtaining imaginary values of said dominant frequencies;

wherein said processor performs said weighted frequency analysis by calculating weighted dominant frequencies and weighted imaginary values based on said dominant frequencies and said imaginary values; and calculate said amount of decoupling capacitance required based on results of said weighted frequency analysis.

13. The system according to claim 12, wherein, processor is further configured to obtain a set of peak imaginary values, comprising a frequency at which magnitude is maximum, a value of an imaginary component at said frequency at which magnitude is maximum, a frequency at which said imaginary component is maximum, and a peak value of said imaginary component.

14. The system according to claim 13, wherein, said processor calculates said amount of decoupling capacitance required using said frequency at which magnitude is maximum, said value of said imaginary component at said frequency at which magnitude is maximum, said frequency at which said imaginary component is maximum, and said peak value of said imaginary component.

15. The system according to claim 12, wherein said processor calculates said amount of decoupling capacitance required based on said weighted dominant frequencies and said weighted imaginary values.

16. A computer program product comprising a computer readable storage device embodying a computer readable program, wherein the computer readable program, when executed on a computer, causes the computer to perform a method of estimating an amount of decoupling capacitance required for an integrated circuit during an initial floorplanning design phase, comprising:

obtaining voltage variation waveforms for a plurality of nodes in a power distribution network of said integrated circuit;

computing a minimum value for each of said voltage variation waveforms;

selecting voltage variation waveforms below a minimum threshold value;

performing a frequency domain analysis on said voltage variation waveforms below said minimum threshold value to create a set of frequency values and equating an imaginary component of said voltage variation waveforms to a reactance corresponding to a needed decoupling capacitance, wherein said performing of said frequency domain analysis comprises performing a fast fourier transform on each of said voltage variation waveforms to obtain frequency domain data, said frequency domain data comprising multiple frequencies that cause a drop in voltage;

performing a weighted frequency analysis on said frequency values;

wherein said performing of said weighted frequency analysis comprises obtaining dominant frequencies below a frequency at which a magnitude is maximum and obtaining imaginary values of said dominant frequencies;

wherein said performing of said weighted frequency analysis further comprises calculating weighted dominant frequencies and weighted imaginary values based on said dominant frequencies and said imaginary values; and calculating said amount of decoupling capacitance required based on results of said weighted frequency analysis.

* * * * *